(12) United States Patent
Hisatomi et al.

(10) Patent No.: US 6,604,218 B1
(45) Date of Patent: Aug. 5, 2003

(54) DATA ENCODING APPARATUS AND DATA DECODING APPARATUS

(75) Inventors: Kenji Hisatomi, Osaka-fu (JP); Kazuyuki Murata, Kyoto-fu (JP); Takehito Yamaguchi, Osaka-fu (JP); Hideyuki Kuwano, Osaka-fu (JP); Yuji Okada, Hyogo-ken (JP); Naoki Takahashi, Osaka-fu (JP); Joji Tanaka, Osaka-fu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/479,900

(22) Filed: Jan. 10, 2000

(30) Foreign Application Priority Data

Jan. 12, 1999 (JP) .......................... 11-005588

(51) Int. Cl.[7] .............................. H03M 13/00
(52) U.S. Cl. ...................... 714/755; 714/761
(58) Field of Search ................. 714/755, 757, 714/761, 787

(56) References Cited

U.S. PATENT DOCUMENTS

| | | | | |
|---|---|---|---|---|
| 5,363,408 A | * | 11/1994 | Paik et al. | 375/261 |
| 5,479,418 A | * | 12/1995 | Hughes-Hartogs | 714/755 |
| 5,519,734 A | * | 5/1996 | Ben-Efraim | 375/341 |
| 5,710,419 A | * | 1/1998 | Wang et al. | 235/487 |
| 5,710,783 A | * | 1/1998 | Luthi et al. | 714/755 |
| 5,719,884 A | * | 2/1998 | Roth et al. | 714/755 |
| 5,835,165 A | * | 11/1998 | Keate et al. | 375/240.27 |
| 5,841,794 A | * | 11/1998 | Inoue et al. | 714/755 |
| 5,880,453 A | * | 3/1999 | Wang et al. | 235/462.01 |
| 6,029,264 A | * | 2/2000 | Kobayashi et al. | 714/755 |
| 6,126,074 A | * | 10/2000 | He et al. | 235/454 |
| 6,144,324 A | * | 11/2000 | Sasaki | 341/94 |

FOREIGN PATENT DOCUMENTS

EP  565738 A1 * 10/1993 .......... G06K/19/06

OTHER PUBLICATIONS

Stephen B. Wicker, "Error Control Systems for Digital Communication and Storage", Prentice–Hall, 1995.*
Gulliver, T.A.; Mortimer, B.; Pressman, I.S. and Ulvr, J.; Reed–Solomon bar codes for mail processing; 1997 IEEE Pacific Rim Conference on Communications, Computers and Signal Processing, vol.: 2, 1997, pp.: 874–877 vol.2.*
Hattori, M. and Saitoh, Y.; New codes for bar code type recording systems; Conference Proceedings Singapore ICCS '94 vol.: 3, 1994 pp. 1054–1058 vol.3.*
Popplewell, A. and O'Reilly, J.J.; Simple technique for constructing 2–dimensional maximum–run–length–limited error–control codes; Electronics Letters; vol.:28 Issue: 22, Oct. 22, 1992 pp.: 2060–2061.*

* cited by examiner

Primary Examiner—Albert Decady
Assistant Examiner—Joseph D. Torres
(74) Attorney, Agent, or Firm—McDermott, Will & Emery

(57) ABSTRACT

A data encoding apparatus is provided wherein, in one aspect, bit data are encoded by using at least one kind of error-correcting code out of two kinds of error-correcting modes—random error-correcting code mode and burst error correcting code mode. The encoded bit data are then arranged in a specific two-dimensional region in a matrix to form a two-dimensional image, which is then printed on a medium. The encoded bit data may be relocated in accord with a relocation map.

4 Claims, 20 Drawing Sheets

Hamming encoding →

(b)

Ha | 1 | 2 | 3 4 | 5 | 6 7 | 8 |
Hb | 1 | 2 | 3 | 4 5 | 6 | 7 8
⋮         ⋮
Hd  1 2 | 3 | 4 5 6 | 7 | 8

Reed-Solomon encoding ↙

(c)  ┌─ Block

Ra (Ha) | 1 | 2 | 3 4 | 5 | 6 7 | 8 |
Rb (Hb)  1 2 | 3 | 4 5 | 6 | 7 | 8 |
⋮              ⋮
Rd (Hd) | 1 | 2 | 3 4 | 5 | 6 7 | 8 |
Re (He)  1 2 | 3 | 4 | 5 | 6 7 | 8 |
⋮              ⋮
Rh (Hh) | 1 | 2 | 3 | 4 5 6 7 | 8 |

Block

Linear noise in a direction
different from that of block

Bk:Block

N0:Linear noise in the same direction as that of block

FIG.12

| a1 | b1 | c1 | d1 | e1 | f1 | g1 | h1 |
|----|----|----|----|----|----|----|----|
| h2 | a2 | b2 | c2 | d2 | e2 | f2 | g2 |
| g3 | h3 | a3 | b3 | c3 | d3 | e3 | f3 |
| f4 | g4 | h4 | a4 | b4 | c4 | d4 | e4 |
| e5 | f5 | g5 | h5 | a5 | b5 | c5 | d5 |
| d6 | e6 | f6 | g6 | h6 | a6 | b6 | c6 |
| c7 | d7 | e7 | f7 | g7 | h7 | a7 | b7 |
| b8 | c8 | d8 | e8 | f8 | g8 | h8 | a8 |

N3

BCH encoding

DATA ENCODING APPARATUS AND DATA DECODING APPARATUS

BACKGROUND OF THE INVENTION

1. Field of the Invention

The present invention relates to an apparatus for encoding data when data are stored as an image in a specific two-dimensional region, such as a two-dimensional code, and an apparatus for decoding the stored encoded data.

2. Description of the Prior Art

Bar code-based control systems are widely used in such fields as commodity distribution and parts management at industrial plants. Recent progress in image processing technology and increased availability of charge coupled device (CCD) cameras have promoted development and application of two-dimensional bar codes because of the advantage over the one-dimensional bar codes in information storage capacity.

Appropriate utilization of the large information storage capacity provided by such two-dimensional codes is generally effected by addition of an error-correcting function to protect against noises that could damage or break bit data within the two-dimensional code. Such a function is provided for in the "two-dimensional code technical specification AIMJ-TC-3-1" issued by AIM Japan. The two-dimensional code called the QR code described in the specification has a function of correcting reading errors of bit data caused by such a noise as a stain resting on the two-dimensional code. The error-correcting function is created by adding bit data for error correction through application of either the Reed-Solomon code or the Hamming code.

That function of correcting a reading error of bit data is different in efficiency depending on the encoding mode applied, that is, the noise pattern. There are different noise patterns. One encoding mode is effective against some noise patterns but does not work well on others. To be specific, the Reed-Solomon code mode is effective in correcting burst errors while the Hamming code mode is suitable for correcting random errors. In addition, there are such code modes as the extended Hamming code and BCH (Bose/Chaudhuri/Hocquengen) code, which are effective in dealing with random errors, and the eraser code and adjacency code, which are useful for correction of burst errors.

The problem with the prior art data encoding and data decoding apparatuses is that they can fail to correct some errors caused by linear noises which are liable to appear in the longitudinal direction when a two-dimensional image is printed or by linear noises which are often observed in the latitudinal direction when media such as paper on which a two-dimensional image is printed is bent.

In the Reed-Solomon code mode, bit data is divided into a number of blocks Bo–Bj. Parity blocks Bpo–Bpj are added to those blocks Bo–Bj to provide a function of correcting burst errors—for block-wise correction, as shown in FIG. 20.

However, the number of correctable blocks is limited. The error-correcting function can not work on linear noises extending over a plurality of blocks exceeding that limit.

In the Hamming code mode, also, bit data is divided into a plurality of fields of sets Qo–Qk to which error-correcting bits Qpo–Qpk are added to produce a function of correcting random errors—a function of correcting the respective bits making up a set, as shown in FIG. 21.

However, there is a limit to the number of correctable bits in a set. It is impossible to correct errors involving a number of bits exceeding that limit, for example, errors caused by a linear noise in the longitudinal direction in the aforesaid sets.

Another problem with the prior art data encoding and data decoding apparatuses is that they can not select an error correcting code mode in such a way as to minimize the decoding time to beat those frequent noises.

SUMMARY OF THE INVENTION

The present invention is to solve those problems. Accordingly, it is an object of the present invention to provide a data encoding apparatus which encodes bit data using two error-correcting modes—the random error correcting code mode and the burst error correcting code mode—and such a data decoding apparatus. It is another object of the present invention to ensure that the error-correcting function will work without fail, whichever linear noise, longitudinal or latitudinal, may be involved and to minimize the decoding time including the error-correcting time by changing (after mentioned) bit data relocation maps according to the direction of the linear noise liable to get on the two-dimensional image.

To effect those objects, the present invention is built up on the following means.

That is, the data encoding apparatus according to the present invention is characterized in that bit data are encoded using at least one kind of error-correcting code in each of two the error-correcting modes—the random error correcting mode and the burst error correcting mode and that the encoded bit data are then arranged in a matrix in a specific two-dimensional region to produce and print a two-dimensional image on a medium.

In this case, the following alternative is possible: the encoded bit data is relocated on the basis of a relocation map. When that encoded bit data is relocated in a specific two-dimensional region on the basis of the relocation map, the set of bit data to which the random error-correcting code is added is arranged or relocated linearly in the specific two-dimensional region in one direction, that is, either in columns or in rows.

The following arrangement is also suitable. That is, there are provided relocation map holding means holding a plurality of relocation maps as described above and relocation map specifying means that selects a relocation map to be used by the aforesaid relocation means. This relocation map specifying means selects the relocation map in which the direction of the most frequent bit error and the longitudinal direction of the set of the aforesaid bit data cross each other.

Meanwhile, the data encoding apparatus of the present invention is characterized in that it is provided with two-dimensional image reading means which reads in a two-dimensional image printed on the medium and converts the same into electronic data or bit data in the data encoding apparatus according to the present invention. The inventive apparatus is also provided with random error correcting means which corrects errors and decodes in sets of those converted bit data given an addition of the random error correcting code and burst error correcting means which corrects errors and does decoding in sets of those converted bit data given an addition of the burst error correcting code.

In this case, it is possible to provide map location restoring means behind the aforesaid two-dimensional image reading means—map location storing means that converts the aforesaid read two-dimensional image such as two-dimensional code into bit data before the rearrangement on the basis of the above-mentioned relocation map.

In the data encoding apparatus and the data decoding apparatus of the present invention, the aforesaid burst error correcting code will act on noises in the longitudinal direction of the random encoded bit data. Noises that extend over a plurality of blocks of burst encoded bit data are dealt with by the above-mentioned random error correcting code. Therefore, noises in any direction in a two-dimensional image will be picked up by the error correcting function without fail. Furthermore, use of a plurality of error correcting codes—random error correcting code and burst error correcting code—could correct errors caused by noises more complicated in shape.

It is also possible to minimize the decoding time including the error correcting time the following way. A relocation map of bit data is prepared in accordance with the direction of the aforesaid noise. Or the relocation map is changed depending on in which direction the linear noise lies that is liable to appear on the two-dimensional image. The change is effected in such a way that the direction of the bit data block and the noise direction cross each other. That way, priority is given to the random error correcting code mode that is quick in correcting errors, thereby minimizing the decoding time.

BRIEF DESCRIPTION OF THE DRAWINGS

FIG. 4 is an explanatory diagram showing the steps of encoding bit data in the data encoding/decoding apparatus of the first embodiment.

FIG. 12 is a diagram showing a relocation map which arranges bit data diagonally on the paper.

DESCRIPTION OF THE PREFERRED EMBODIMENTS

Now, the embodiments of the present invention will be described with reference to the accompanying drawings.

Embodiment 1

Figure 1:
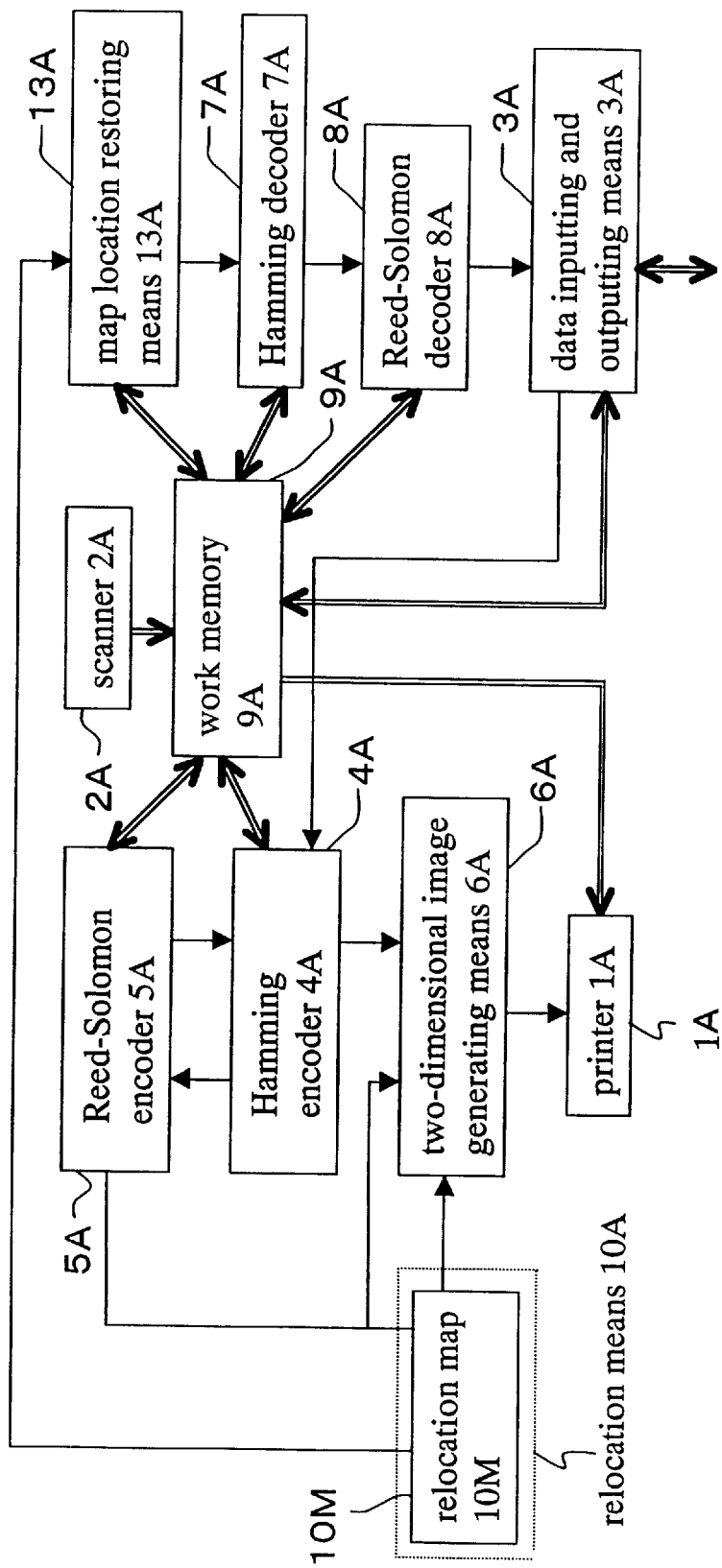
FIG. 1 is a block diagram of the data encoding/decoding apparatus of a first embodiment according to the present invention.

FIG. 1 is a block diagram of a data encoding/decoding apparatus of a first embodiment. There will be explained the arrangement for encoding the bit data in this apparatus with reference to FIG. 2. It is to be understood that, in FIG. 1, the solid lined arrows indicate the flow direction of the process while the double lined arrows show the flow direction of bit data.

A specific size of bit data, for example, 16 bits of bit data, input from data inputting/outputting means 3A is input into work memory 9A. At the same time, a Hamming encoder 4A is activated, such as an 8.4 Hamming encoding mode as used in this example. In this Hamming encoder 4A, a bit data on the work memory 9A is divided into sets Da–Dd of a specific number of bits (in this case, four sets, each set made up of four bits) as shown in FIG. 4(a). To the respective sets Da–Dd are added four bits—error-correcting bits 5–8 derived from the (8.4) Hamming encoding mode—as shown in FIG. 4(b) to produce 8-bit sets Ha–Hd (Steps 1a14 2a).

The (8.4) Hamming encoding mode can correct an error in one bit out of 8-bit data making up one set as shown. That means, the Hamming encoder 4A imparts a random error correcting function for correcting an error in an error bit staying isolated in the bit data string. If two or more bit errors in the bit data string are to be corrected, a Hamming encoding mode with more correcting bits has to be used.

If the Hamming encoder 4A adds random error correcting bits as shown, then a Reed-Solomon encoder 5A will start up. This Reed-Solomon encoder 5A generates four parity blocks Re–Rh as shown in FIG. 4(c) and adds them to each of the four sets Ra–Rd(=Ha–Hd) of 8-bit bit data (Step 3a).

Parity blocks Re–Rh are each made up of 8 bits. The error-correcting function to which the Reed-Solomon encoding mode is applied can correct up to two blocks in four sets Ra–Rd and four parity blocks Re–Rh combined, that is, 8 blocks Ra–Rh. That means that the Reed-Solomon encoder 5A imparts an error-correcting function for correcting errors intensively occurring in the bit data making up one block, that is, a burst error-correcting function. But if errors are to be corrected in more blocks, more correcting blocks will have to be used.

In the above description, the random encoding is first performed. Needless to say, the burst encoding may come first.

In the next step, two-dimensional image generating means 6A starts up. On the basis of bit data added by random error and burst error correcting codes—the bit data present on the work memory 9A—, the two-dimensional image generating means 6A generates two-dimensional images, for example, a two-dimensional code, which is described below. When the bit data is substituted with the two-dimensional code then, the respective blocks Ra–Rh obtained from the Reed-Solomon encoder 5A are arranged in a specific two-dimensional region (with specific numbers of arranged bits in columns or rows) in one direction with each block as one unit, either in a column or row, as shown in FIG. 5(c) (Step 4a).

Figure 5:
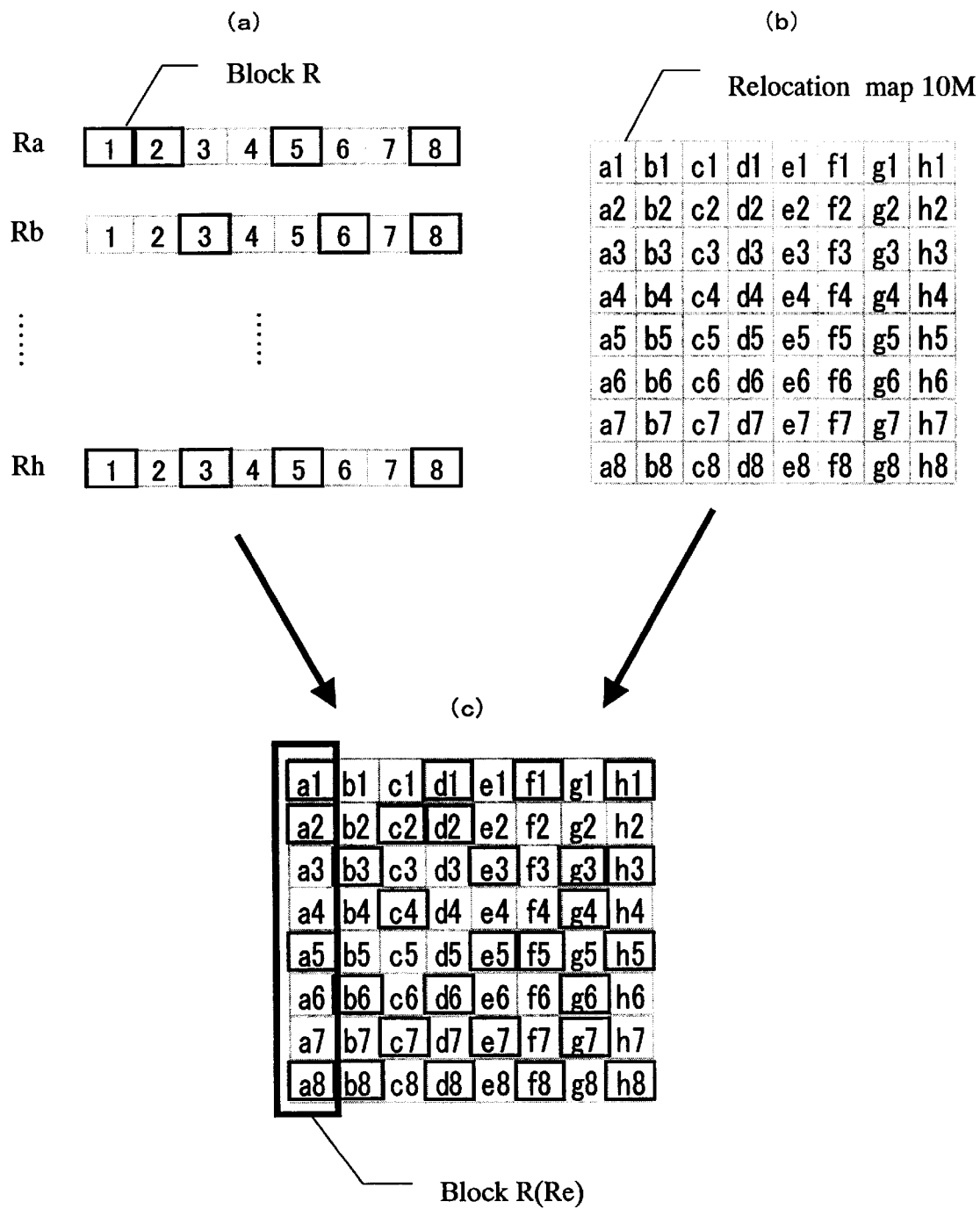
FIG. 5 is an explanatory diagram showing the steps of relocating dots on a two-dimensional image in the data encoding/decoding apparatus of the first embodiment.

That arrangement order is shown in a relocation map 10M or relocation means 10A in FIG. 5(b). The two-dimensional image generating means 6A arranges the blocks Ra–Rh of the above-mentioned bit data as shown in FIG. 5(c) according to the relocation map 10M. It is understood that in FIGS. 5(b) and (c), the letters a–h indicate blocks while the numbers 1–8 signify arrangement or position numbers of bit data within one block.

The two-dimensional code thus generated is input in a printer 1A for printing out as two-dimensional image on such media as paper (Step 5a).

Figure 3:
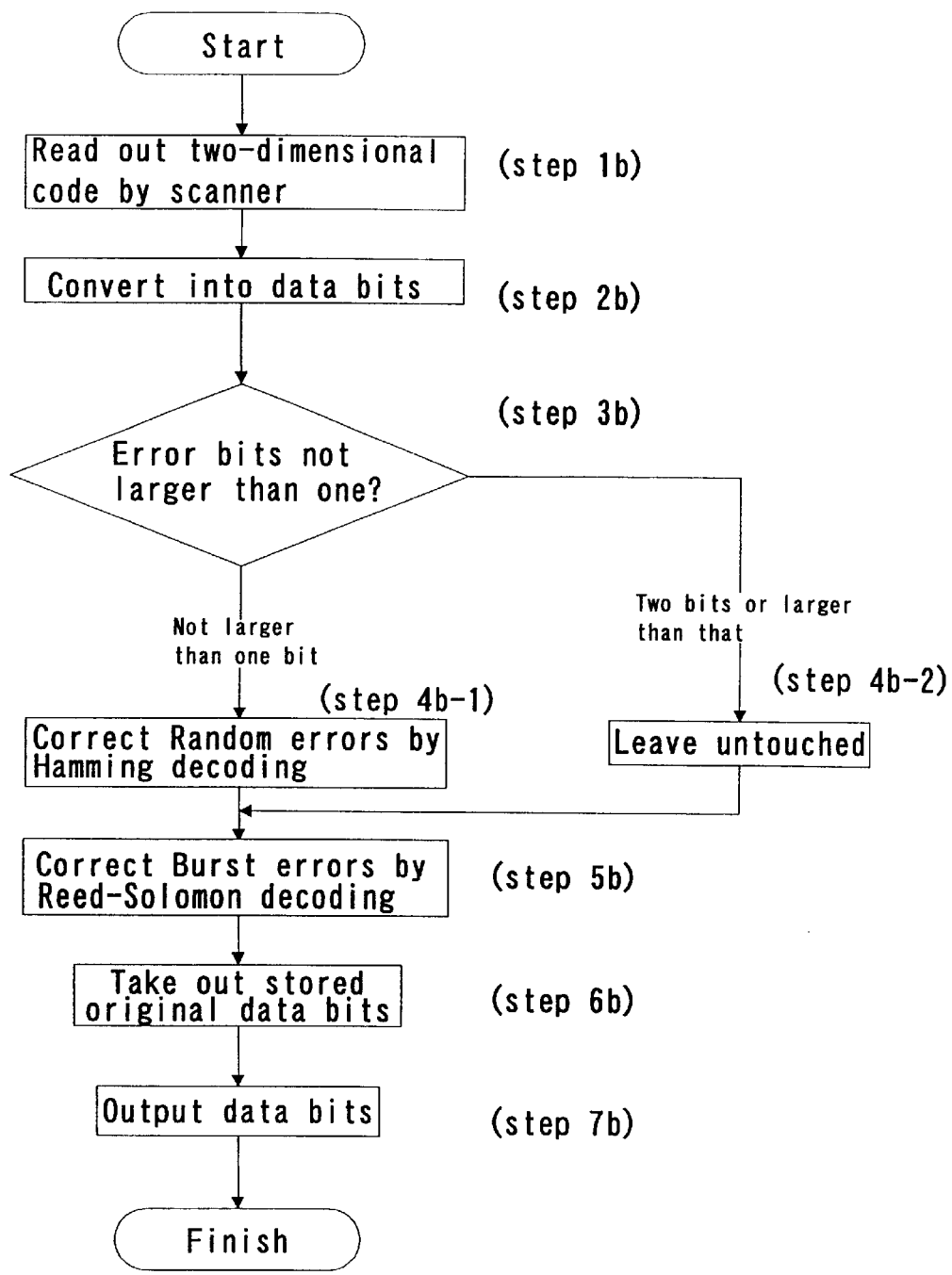
FIG. 3 is a flow chart of data decoding in the data encoding/decoding apparatus of the first embodiment.

Now, the decoding of bit data in the data encoding/decoding apparatus of the first embodiment will be explained with reference to the flow chart in FIG. 3.

The two-dimensional image printed out on a medium, like paper, is read by a scanner 2A (Step 1b) and input into the work memory 9A. At the same time, map location restoring means 13A starts up.

In this map location restoring means 13A, the bit data rearranged by the two-dimensional image generating means 6A according to the relocation map 10M is restored to the state before the rearrangement on the basis of that relocation map 10M (Step 2b).

As the bit data is restored, a Hamming decoder 7A is activated (Step 3b).

Figure 6:
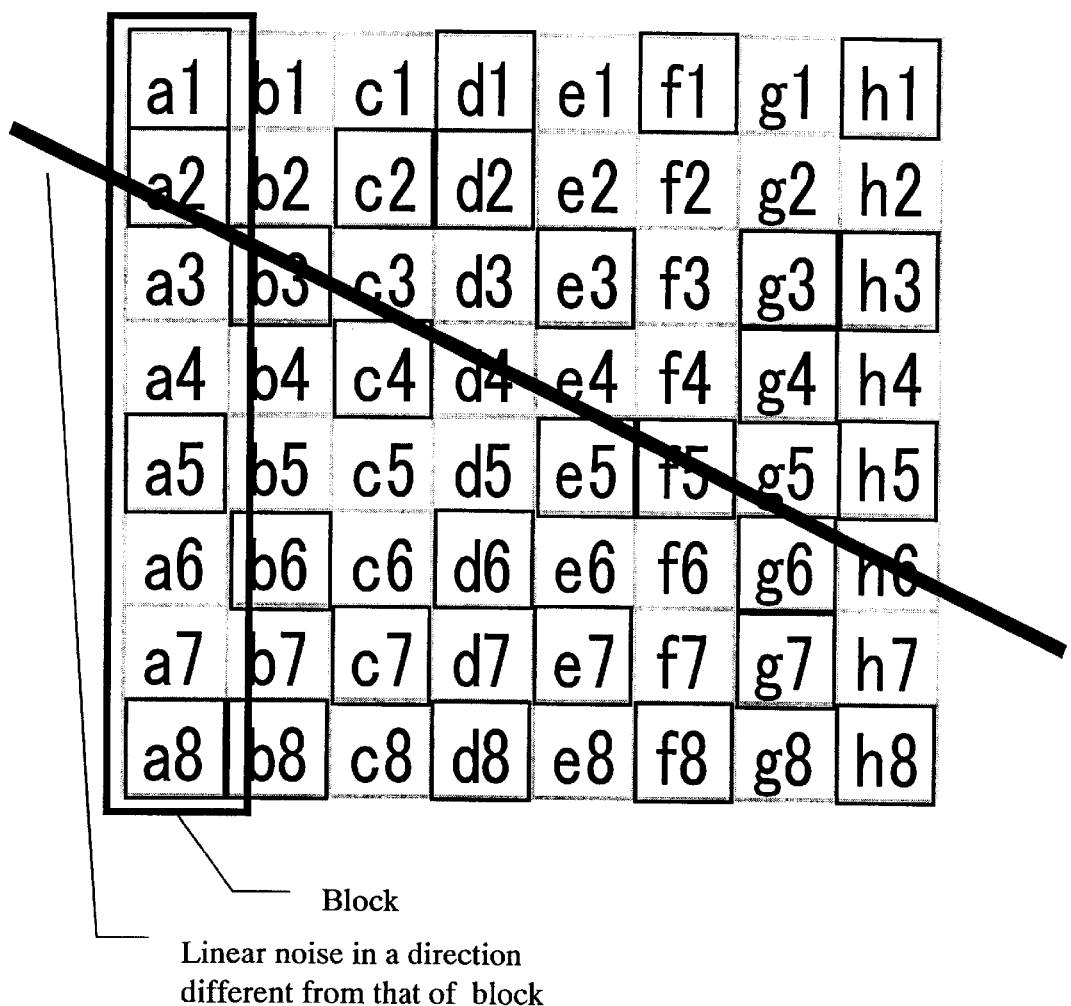
FIG. 6 is an illustration showing an example of a linear noise lying on the image in a direction crossing the respective blocks.

Even if a linear noise lies diagonally across a two-dimensional image in a direction different from that of the linearly formed blocks as shown in FIG. 6, the noise can break not more than one bit in one block. Therefore, the Hamming decoder 7A corrects the error bits by the random error-correcting function (Step 4b-1).

Figure 7:
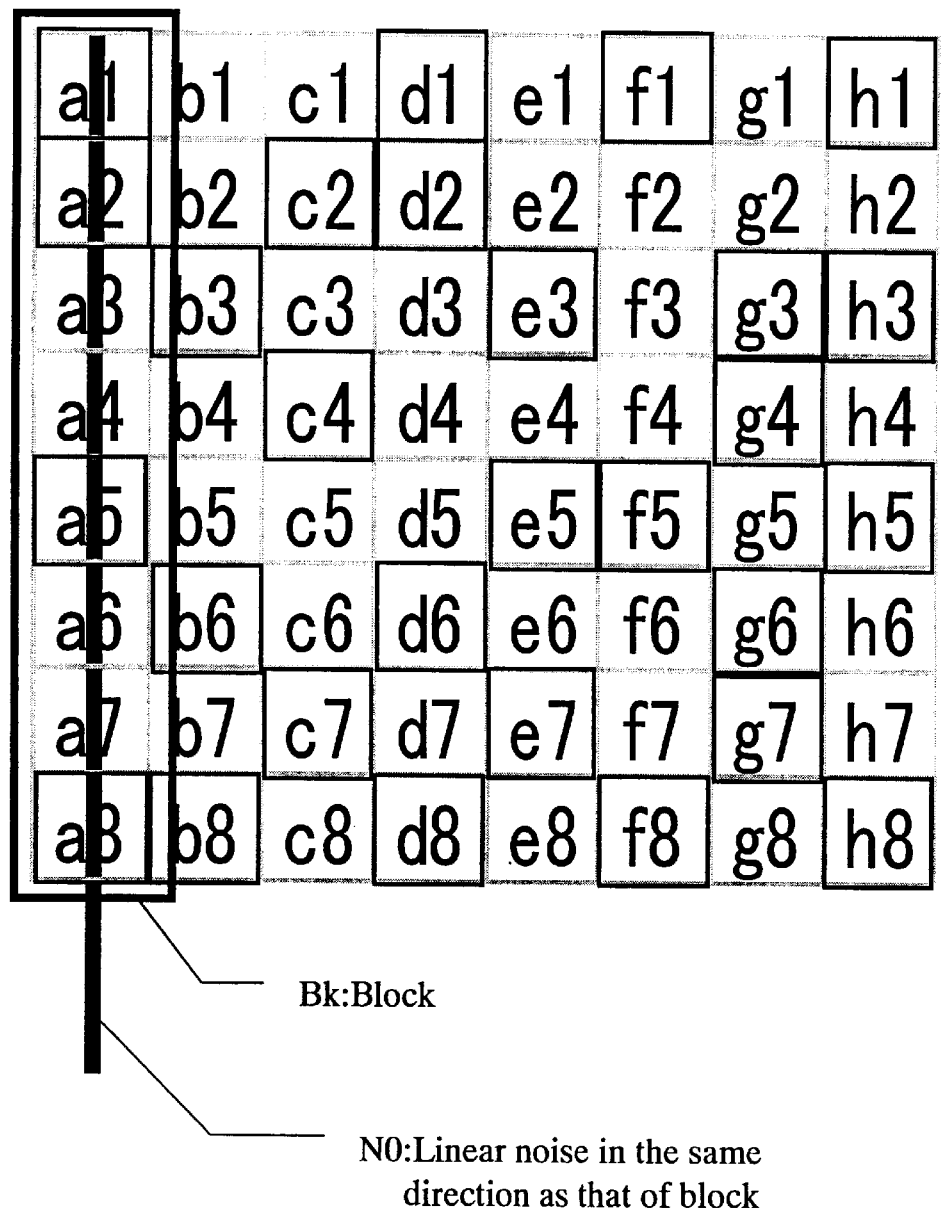
FIG. 7 is an illustration showing an example of a linear noise lying on a block in the same direction as the blocks.

In case the noise N0 lies in the same direction as the linearly formed block Bk as shown in FIG. 7 and if two or more bits in the block are broken, the bit data are not repaired in the Hamming decoder 7A but treated in an Reed-Solomon decoder 8A (Step 4b-2).

In other words, as the treatment is over at the Hamming decoder 7A, the Reed-Solomon decoder 8A is started up to correct burst errors.

That is, as shown in FIG. 6, although a linear noise is diagonally on a two-dimensional image, if the noise can damage not more than one bit in one block as long as the noise is in a direction different from that of the blocks, the errors are corrected by the Hamming decoder 7A in Step 4b-1.

If the linear noise lies longitudinally across the two-dimensional image in the same direction as the blocks as shown in FIG. 7 and if two or more bits are damaged in the block, then the errors are referred to the Reed-Solomon decoder 8A without being repaired in the Hamming decoder 7A. In this case, the other seven blocks are left undamaged. Using those seven undamaged blocks, the burst error-correcting function of the Reed-Solomon decoder 8A can correct the block containing the error bits (Step 5b).

As the bit data is restored on the work memory 9A to the original state by the Hamming decoder 7A and the Reed-Solomon decoder 8A as described, the bit data is transferred to data inputting and outputting means 3A to be output (Steps 6b–7b).

Embodiment 2

The data encoding/decoding apparatus of a second embodiment will be now described.

Figure 8:
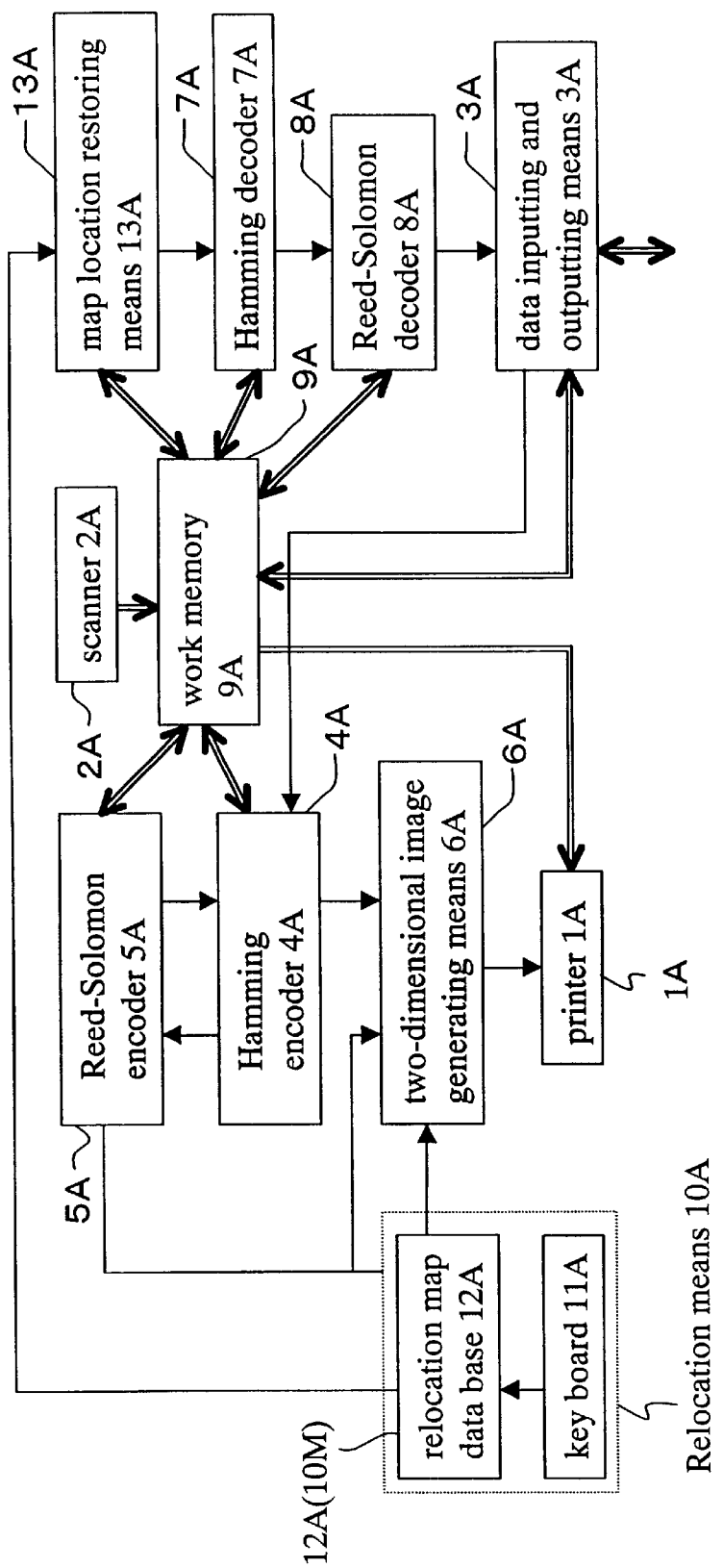
FIG. 8 is a block diagram of the data encoding/decoding apparatus of a second embodiment according to the present invention.

FIG. 8 is a schematic block diagram of the data encoding/decoding apparatus of the second embodiment. In the second embodiment, relocation means 10A in the data encoding/decoding apparatus of the first embodiment is replaced with a relocation map data base 12A and a key board 11A. As in FIG. 1, the solid lined arrows indicate the flow direction of the process while the double lined arrows show the flow direction of bit data.

The relocation map data base 12A, as relocation map holding means, has a plurality of relocation maps 10M. The key board 11A as relocation map specifying means specifies which of the plurality of relocation maps 10M should be used. As long as the relocation map specifying means is one through which the user can make a choice, the means is not limited to the key board 11A. One alternative may be a touch panel with the names, numbers or the like of relocation maps displayed for the user to select.

Now, the process of encoding bit data in the data encoding/decoding apparatus of the second embodiment will be described with reference to FIG. 9.

Figure 2:
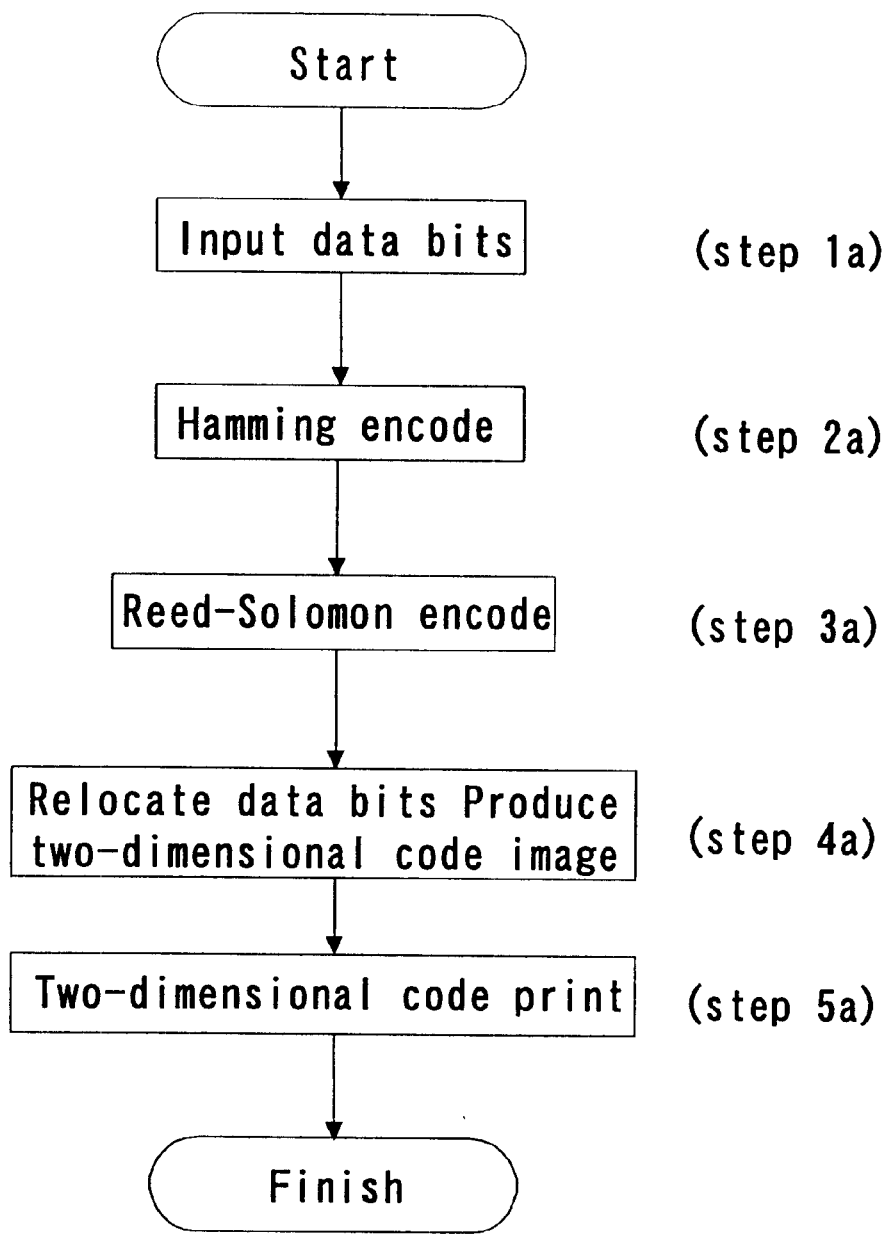
FIG. 2 is a flow chart of data encoding in the data encoding/decoding apparatus of the first embodiment.
Figure 9:
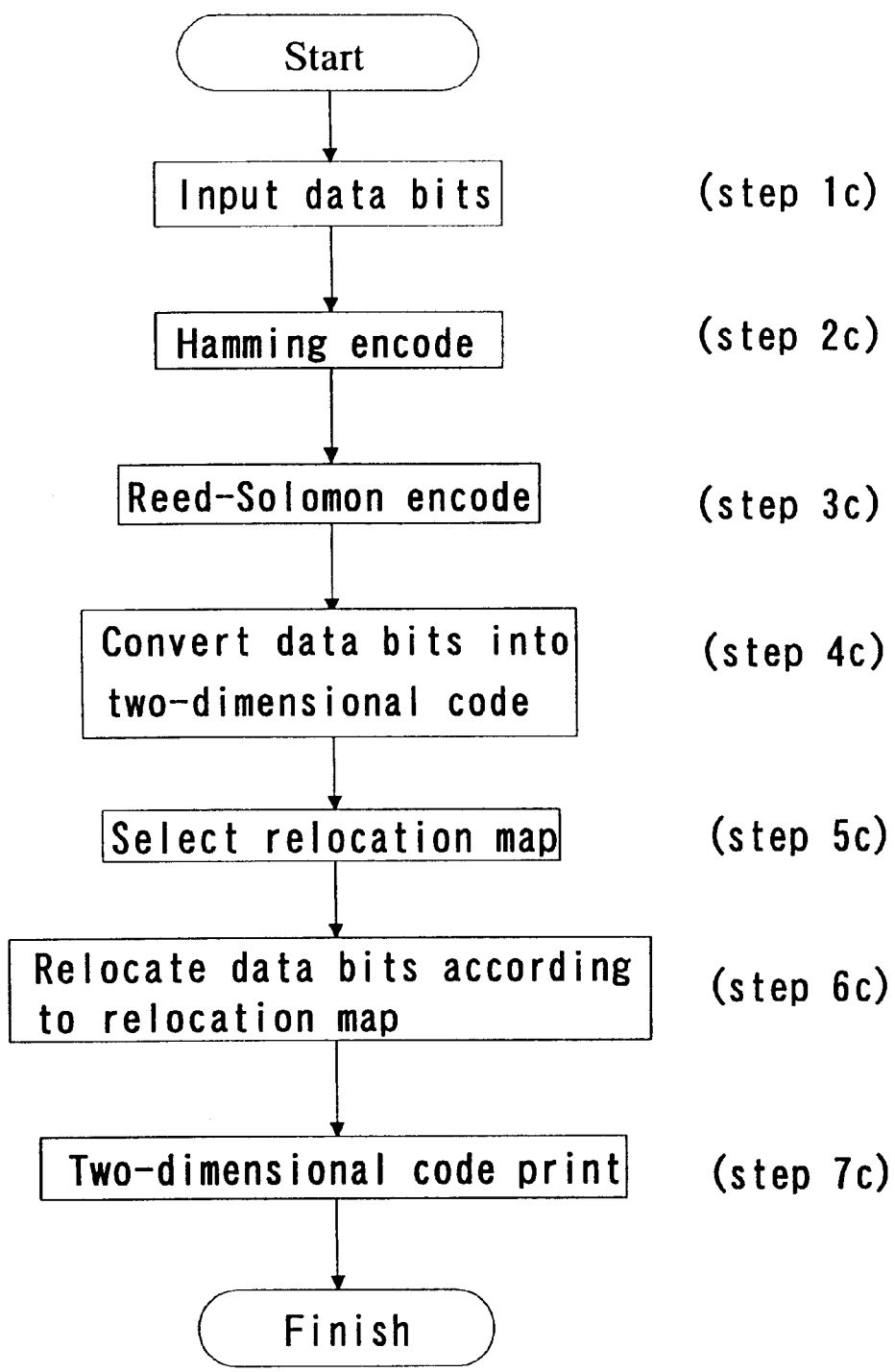
FIG. 9 is a flow chart of data encoding in the data encoding/decoding apparatus of the second embodiment.

The steps 1c to 4c in FIG. 9 are identical with the steps 1a to 5a in the data encoding/decoding apparatus of the first embodiment described with reference to FIG. 2. The description of those steps will not be repeated for brevity.

Figure 10:
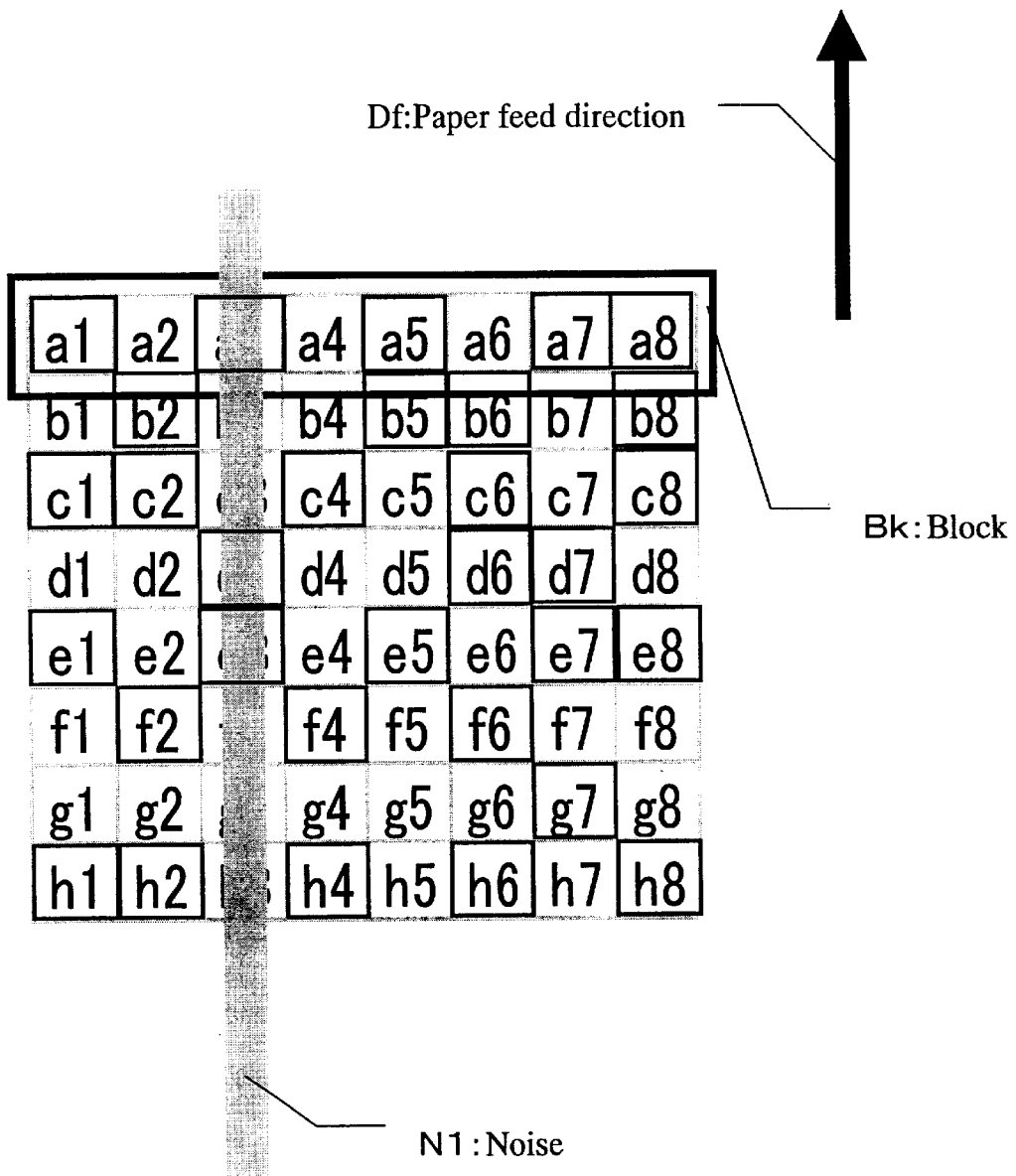
FIG. 10 is a diagram showing a relocation map for a linear noise that lies on the image in the same direction as the paper is discharged.
Figure 11:
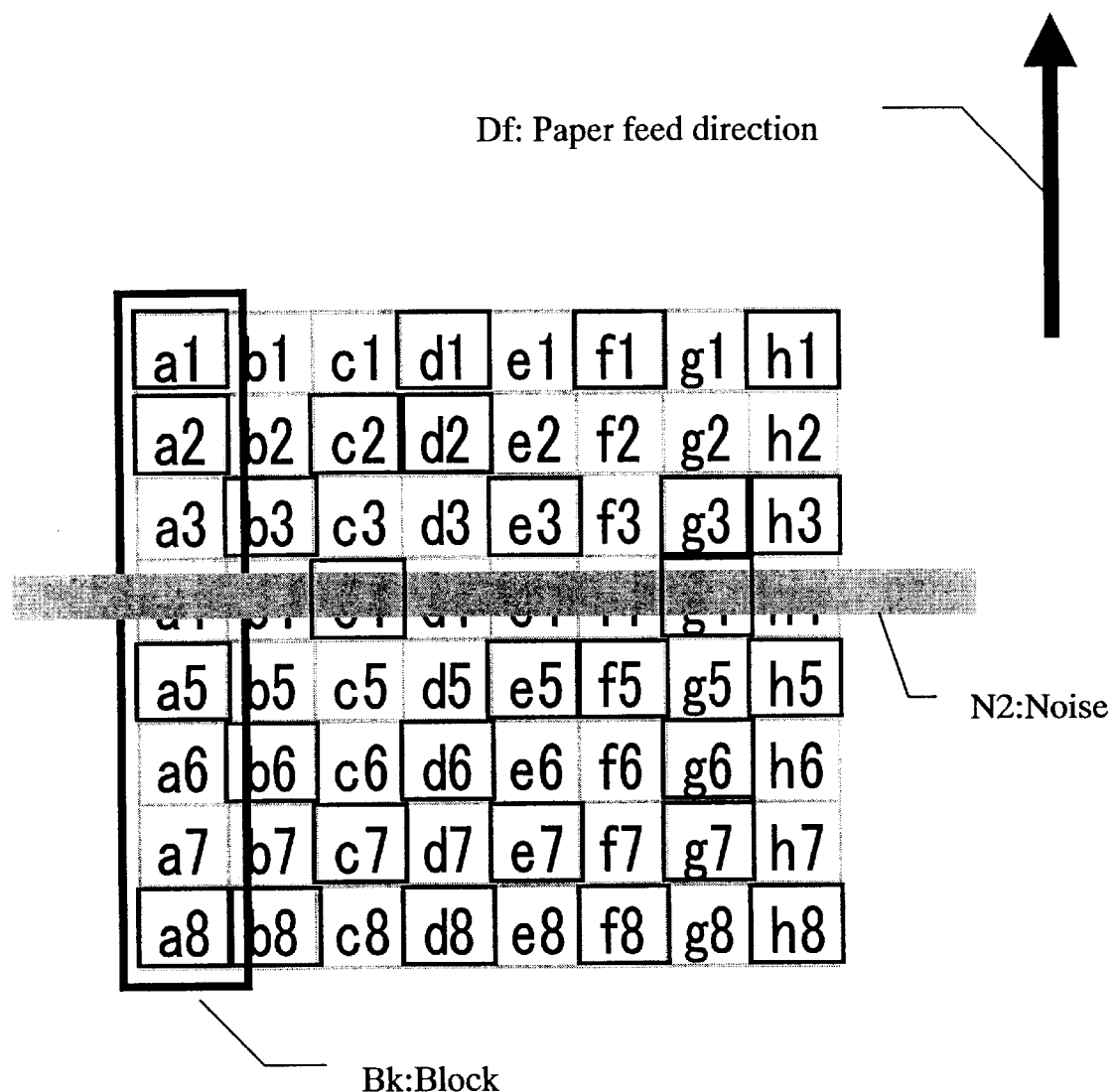
FIG. 11 is a diagram showing a relocation map for a linear noise that lies on the image in the direction perpendicular to the direction in which the paper is discharged.

In the relocation map data base 12A, the data encoding/decoding apparatus of the second embodiment has a plurality of relocation maps with different block directions as shown in FIG. 10 and FIG. 11. Depending on the direction of probable linear noises, the user chooses one among the plurality of relocation maps according to which the bit arrangement is to be effected. The user specifies the relocation map through the key board 11A (Steps 6c–5c).

According to the user's choice, two-dimensional image generating means 6A rearranges the two-dimensional image bit data (Step 6c). Now, the relation between the direction of the linear noise and the arrangement direction of bit data at that time will be explained with reference to FIG. 10 and FIG. 11.

The error correction by the Reed-Solomon code mode, which is used for correcting errors block-wise as shown in FIG. 7, takes more time than that by Hamming code mode. To shorten the treatment time, errors are first corrected by the Hamming code mode so that the number of uncorrected errors may have be reduced when the Reed-Solomon code mode is applied for further correction of errors.

Therefore, a relocation map 10M with the longitudinal direction of the blocks different from that of the noise is selected so that the errors may be corrected effectively by the Hamming code mode, that is, so that it may not happen that many bits are found broken in one block when the error correction is performed.

When the aforementioned procedure is adopted, a relocation map 10M is selected depending on the direction of the noise, as follows.

When a two-dimensional image is printed out by a printer, for example, a linear noise N1 as shown in FIG. 10 is liable to be caused in the feed direction Df of paper as by stains on the roller. In such a case, a relocation map is chosen in which the longitudinal direction of block Bk is orthogonal with the linear noise NI as shown in FIG. 10, that is, block Bk sits in the row.

When a communication error as shown in FIG. 11 is caused in printing out a two-dimensional image through the facsimile unit or the like, the error is printed out as a black or white line. This black or white line is liable to occur as a linear noise N2 in the direction perpendicular to the feed direction Df of paper. In such a case, a relocation map is chosen in which the longitudinal direction of Block Bk is orthogonal with the linear noise N2 as shown in FIG. 11, that is, Block Bk sits in the column.

It is possible that a slant noise unlike those in FIG. 10 and FIG. 11 will be caused. For such a noise, a relocation map as shown in FIG. 12 can be chosen in which the bit data making up block Bk are relocated slant-wise so as to be intersected orthogonally with the linear noise N3.

Further, it is possible to arrange bit data diagonally with the feed direction Df of paper so as to cope with the two kinds of noises as shown in FIG. 10 and FIG. 11. The two-dimensional image thus formed is sent to the printer where it is printed as the two-dimensional image on a medium such as paper (Step 7c).

The process of decoding bit data in the data encoding/decoding apparatus of the second embodiment is the same as that in the first embodiment described with reference to FIG. 3 and is not explained again for brevity.

The data encoding/decoding apparatus of the second embodiment is configured, however, so that at step 5c in FIG. 9, the correction of burst errors is avoided in dealing with the most frequent linear noises, because that correction takes more time than that of random errors. That increases the possibility of saving the decoding time.

Embodiment 3

Figure 13:
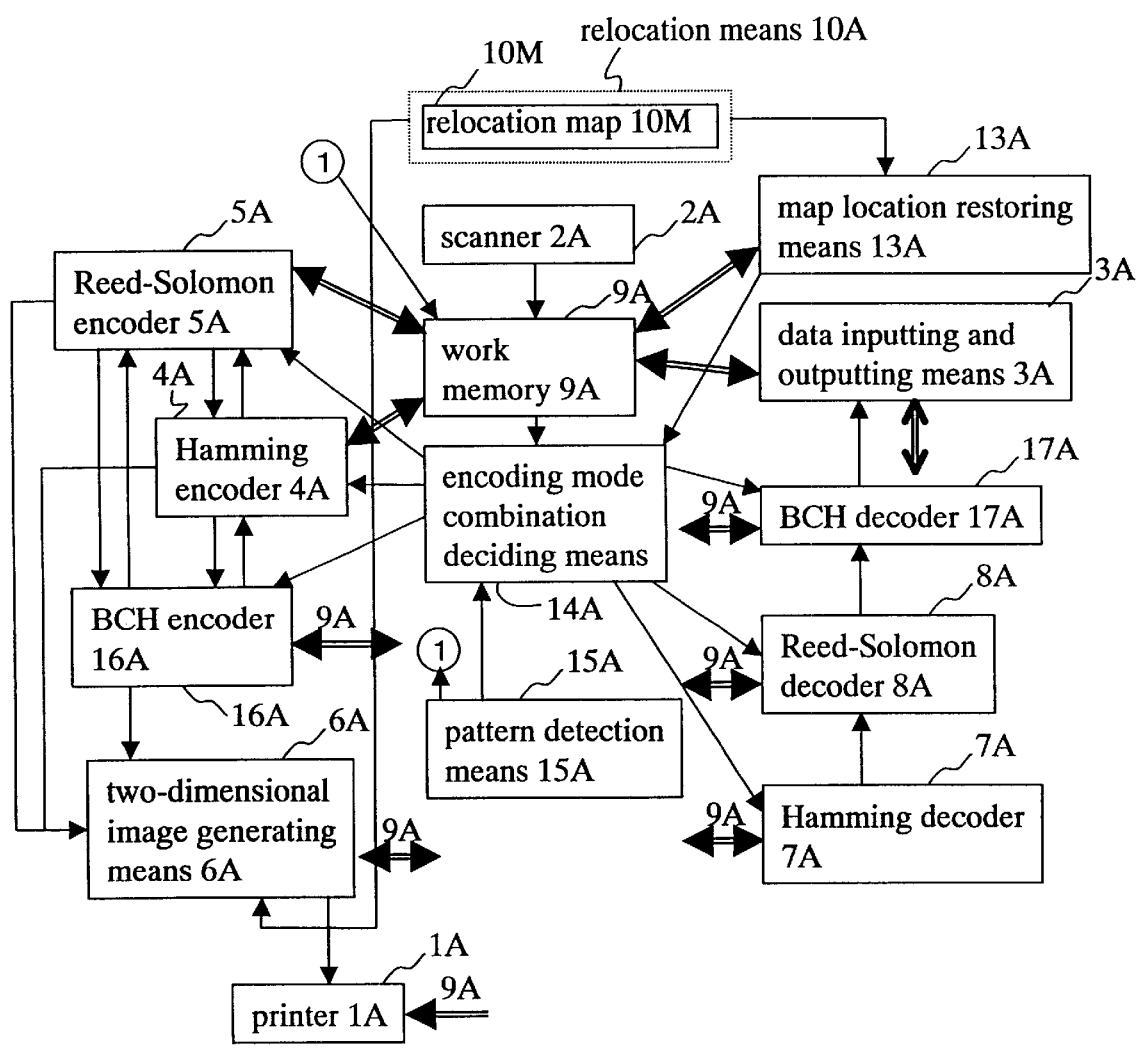
FIG. 13 is a block diagram of the data encoding/decoding apparatus of a third embodiment according to the present invention.
Figure 14:
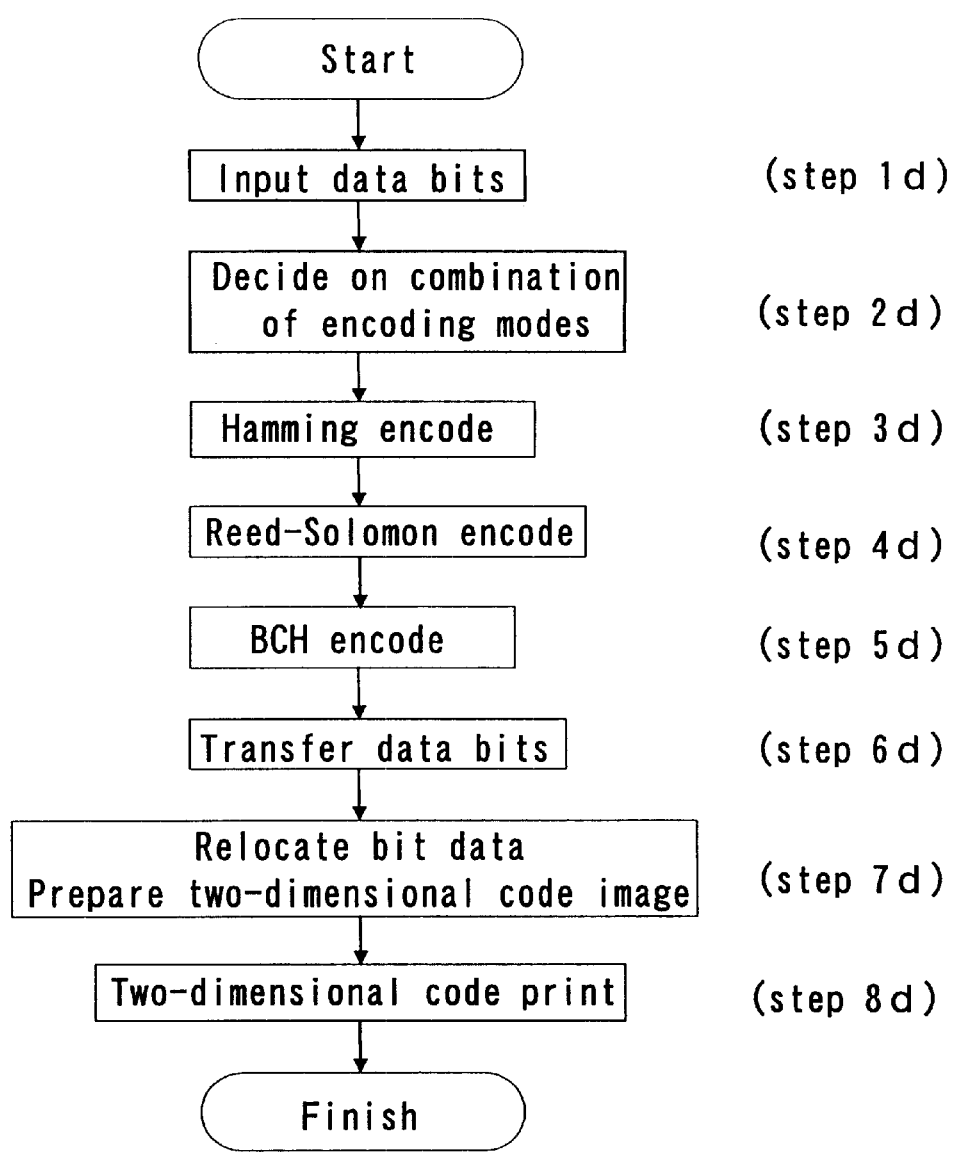
FIG. 14 is a flow chart of data encoding in the data encoding/decoding apparatus of the third embodiment.

FIG. 13 is a block diagram showing the configuration of the data encoding/decoding apparatus of a third embodiment. The arrangement for encoding bit data in this apparatus will be described with reference to FIG. 14. As in FIG. 1, the solid lined arrows indicate the flow direction of the process while the double lined arrows show the flow direction of bit data.

A specific size, say, 16 bits of bit data inputted from data inputting and outputting means 3A is input into the work memory 9A where the data is treated as described below (Step 1d).

As bit data is input into the work memory 9A as described, pattern detection means 15A is activated. This pattern detection means 15A detects the direction pattern or the lay of the lines printed on paper, that is, in which direction of paper, longitudinal or latitudinal, the lines are printed and refers the results to encoding mode combination deciding means 14A. When encoding bit data according to the direction pattern, the encoding mode combination deciding means 14A decides which of the encoding modes—which are described later—are combined in what order (Step 2d).

The direction pattern detected by the pattern detection means 15A is not the only way of determining the noise pattern. Instead, it may be possible to detect the noise pattern in a specific application environment regardless of the lay of lines on paper. Also, the user may incorporate the results drawn from his experience or manual. In the present embodiment, three kinds to be combined are presented—the Hamming code, Reed-Solomon code and BCH (Bose/Chaudhuri/Hocquengen) code.

Of those codes, the Hamming code and BCH code are classified as random error correcting code while Reed-Solomon code is called burst error correcting code. In the following description, the Hamming code, Reed-Solomon code and BCH code are applied in that order to encode bit data in an example.

It is noted that the encoding modes to be provided are not limited to the aforesaid three encoding means and other encoding modes may be used. It may also be so arranged that instead of using all the three codes, only the necessary encoding modes of the three are applied according to the requirements. Also, the same encoding modes may be used repeatedly in such a way that the encoding is done by the Hamming code, BCH code and Hamming code in that order, for example. In the encoding mode combination deciding means 14A, furthermore, a predetermined combination and order may be followed instead of deciding on the combination of encoding modes according to the direction pattern detected by pattern detection means 15A as described above.

In the present embodiment, the bit data on the work memory 9A is treated first by the Hamming code mode, the first encoding mode of the combination picked out by the encoding mode combination deciding means 14A. It is understood that the (8.4) Hamming encoding mode is used here. The process of adding the Hamming code to the bit data is the same as in the first embodiment and will not be described again for brevity.

As the Hamming code (random error correcting bits) is added to the bit data by the Hamming encoder 4A, the Reed-Solomon encoder 5A is activated to add the Reed-Solomon code. This process is also identical with that in the first embodiment and will not be explained again (Steps 1d–5d).

The bit data to which the burst error correcting bits are added by the Reed-Solomon encoder 5A as described above are referred to a BCH encoder 16A. In this example, it is understood that the (16. 15) BCH coding mode is used.

Figure 15:
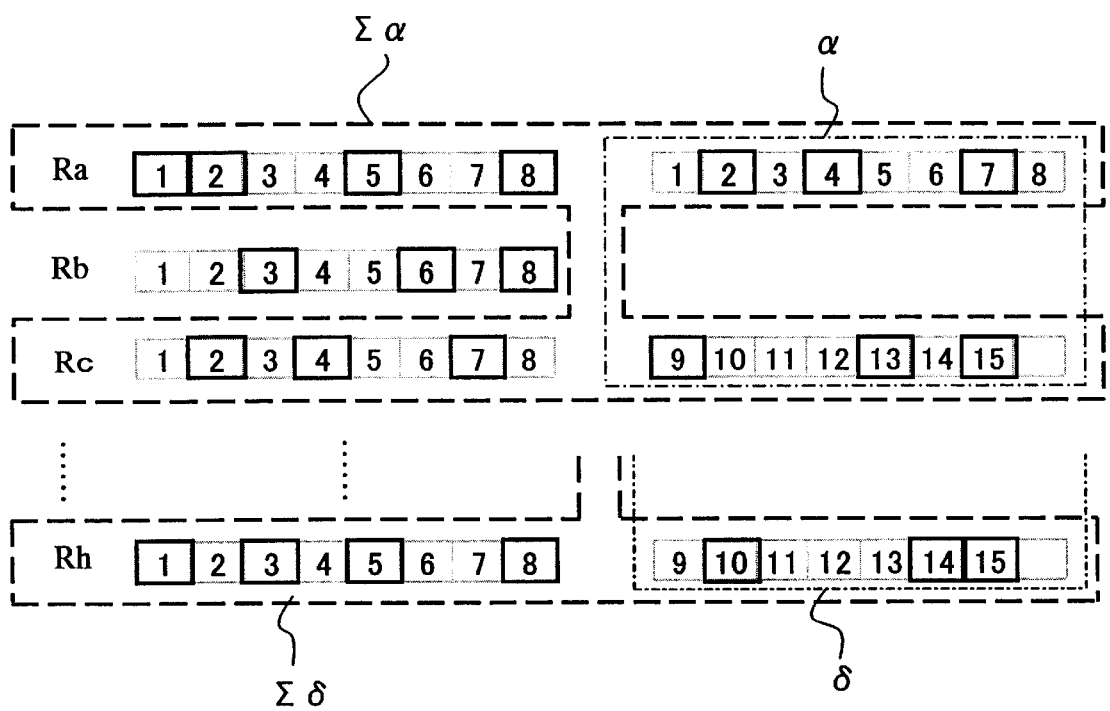
FIG. 15 is an explanatory diagram showing the steps of encoding bit data in the BCH encoding.

The BCH encoder 16A picks up a total of 16 bits contained in block Ra and block Rc out of the 8-bit blocks Ra–Rh shown in FIG. 15 and generates and adds to those 16 bits a corresponding 15-bit parity block $\alpha$, to produce a lump $\Sigma\alpha$. Similarly, the BCH encoder 16A generates a lump $\Sigma\beta$ made up of the bits in blocks Rb and block Rd and the corresponding parity block $\beta$, a lump $\Sigma\gamma$ made up of the bits in blocks Re and block Rg and the corresponding parity block $\gamma$, and a lump $\Sigma\delta$ made up of the bits in blocks Re and block Rg and the corresponding parity block $\delta$(Step 5d). The error-correcting function in which this BCHI code is applied is capable of correcting up to three bits in one lump formed of 31 bits.

The bit data thus given an addition of correcting codes of a plurality of kinds are referred to the two-dimensional image generating means 6A(Step 6d). This two-dimensional image generating means 6A arranges the bit data as shown in FIG. 16(c) according to the relocation map 10M as relocation means 10A and thus produces a two-dimensional code (Step 7d).

Figure 16:
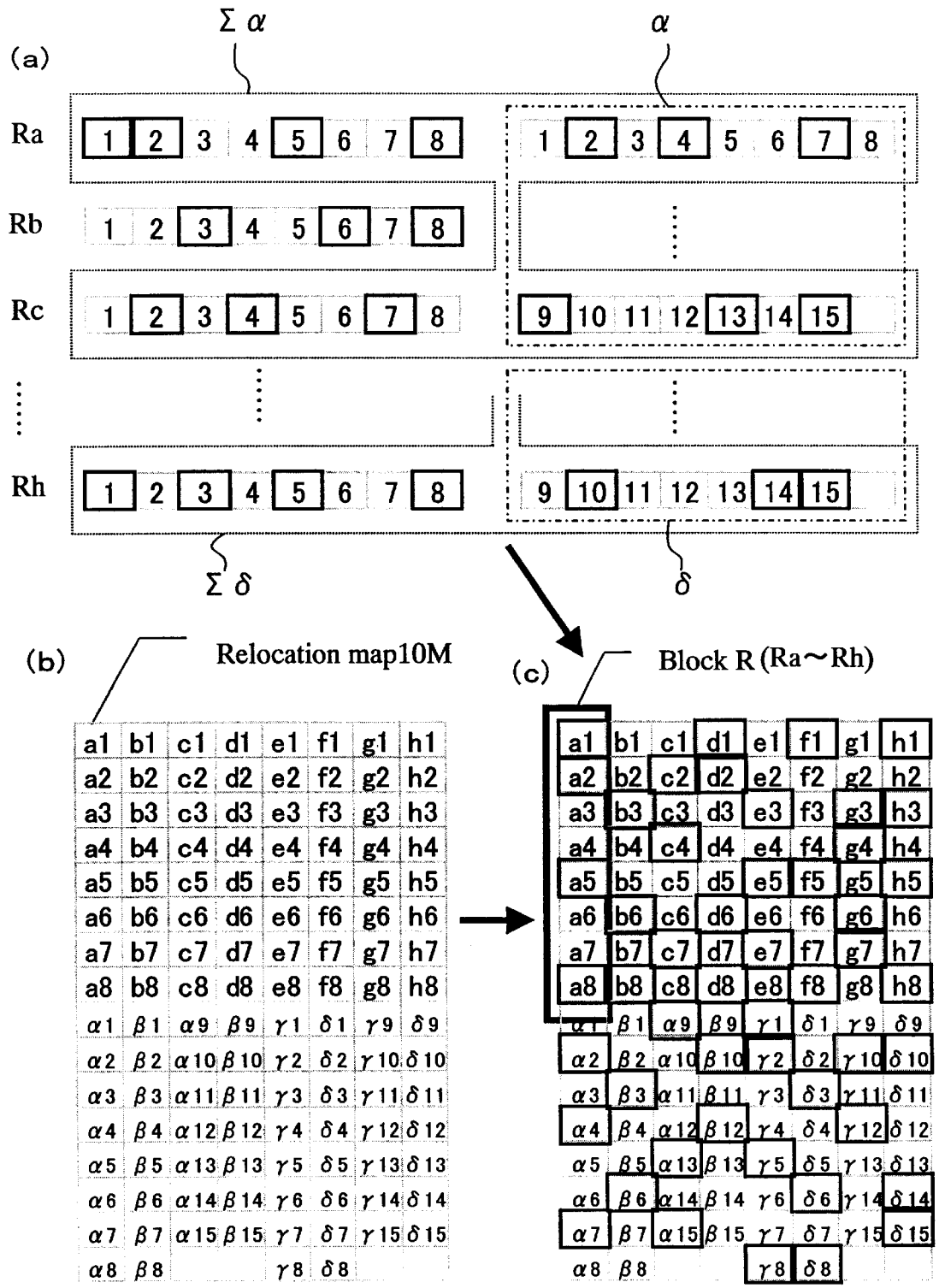
FIG. 16 is an explanatory diagram showing the steps of relocating dots on a two-dimensional image in the data encoding/decoding apparatus of the third embodiment.

It is understood that in FIGS. 16(b) and (c), the letters a to h indicate blocks Ra–Rh and the numerals 1–8 indicate the arrangement or position numbers of bit data in one block. The Greek letters $\alpha$–$\delta$ signify parity blocks and the numerals 1–8 added to the Greek letters $\alpha$–$\delta$ indicate the arrangement or position numbers of bit data in the parity blocks $\alpha$–$\delta$.

Two-dimensional code thus generated is inputted into the printer 1A where the code is printed on a medium such as paper (Step 8d).

Figure 17:
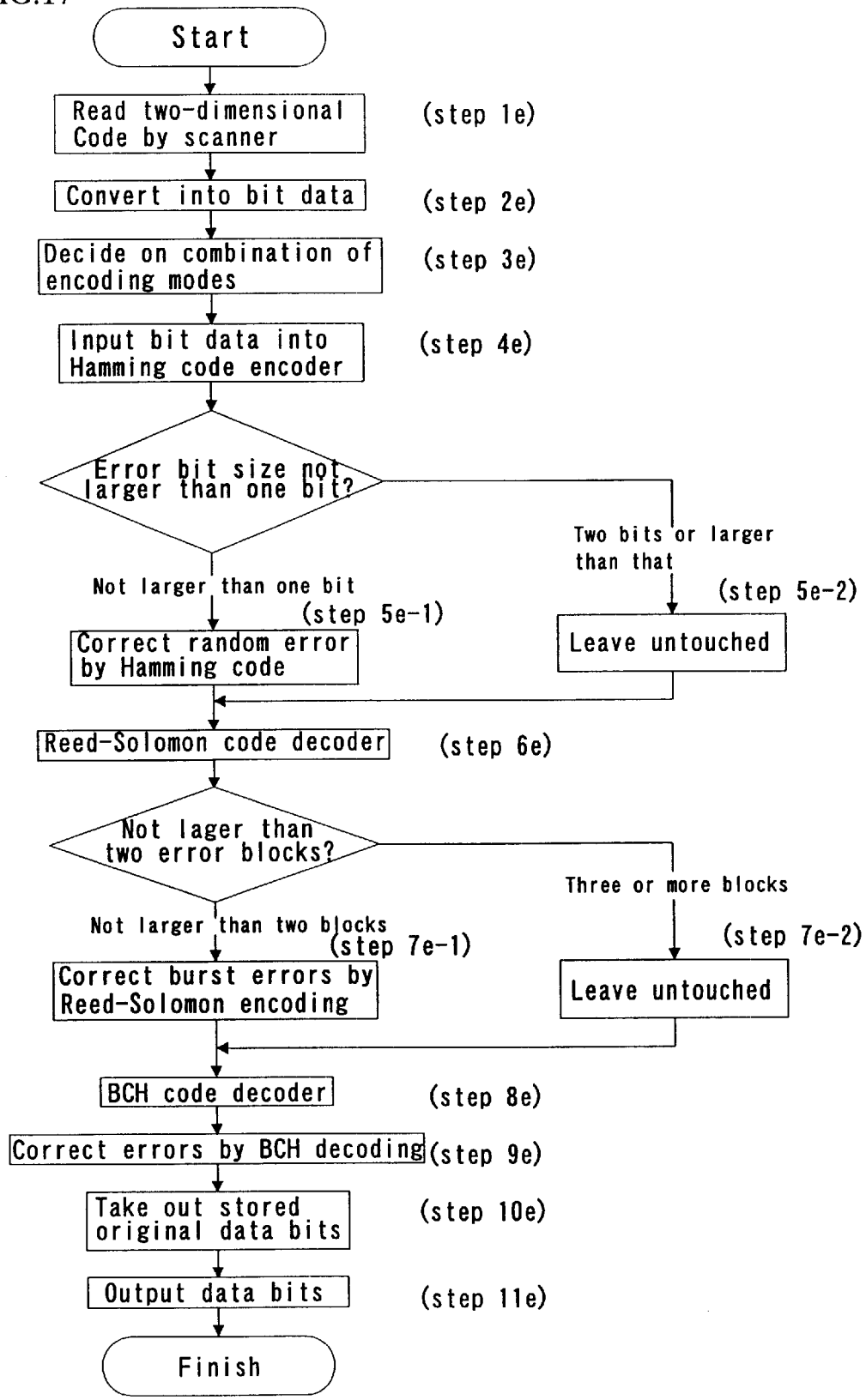
FIG. 17 is a flow chart of data decoding in the data encoding/decoding apparatus of the third embodiment.

Now, there will be explained the process of decoding bit data in the data encoding/decoding apparatus of the third embodiment with reference to FIG. 17.

The two-dimensional code image printed on a medium as paper in the previous step is read by the scanner 2A and inputted into the work memory 9A (Step 1c).

Map location restoring means 13A restores the bit data inputted into the work memory 9A to the state before the rearrangement according to the same relocation map 10M that was used by the two-dimensional image generating means 6A (Step 2e).

Pattern detection means 15A detects the direction pattern according to the bit data restored on the work memory 9A in the previous step and informs encoding mode combination deciding means 14A of the results. So informed, the encoding mode combination deciding means 14A decides on the encoding modes to be combined and the order of their application (Step 3e). According to the decision thus made, the respective decoders are activated to decode the bit data. In this example, it is assumed that the Hamming code, Reed-Solomon code and BCH code are applied in that order. And the bit data arranged to the original state by the map location restoring means 13A is first referred to the Hamming decoder 7A (Step 4e).

Figure 18:
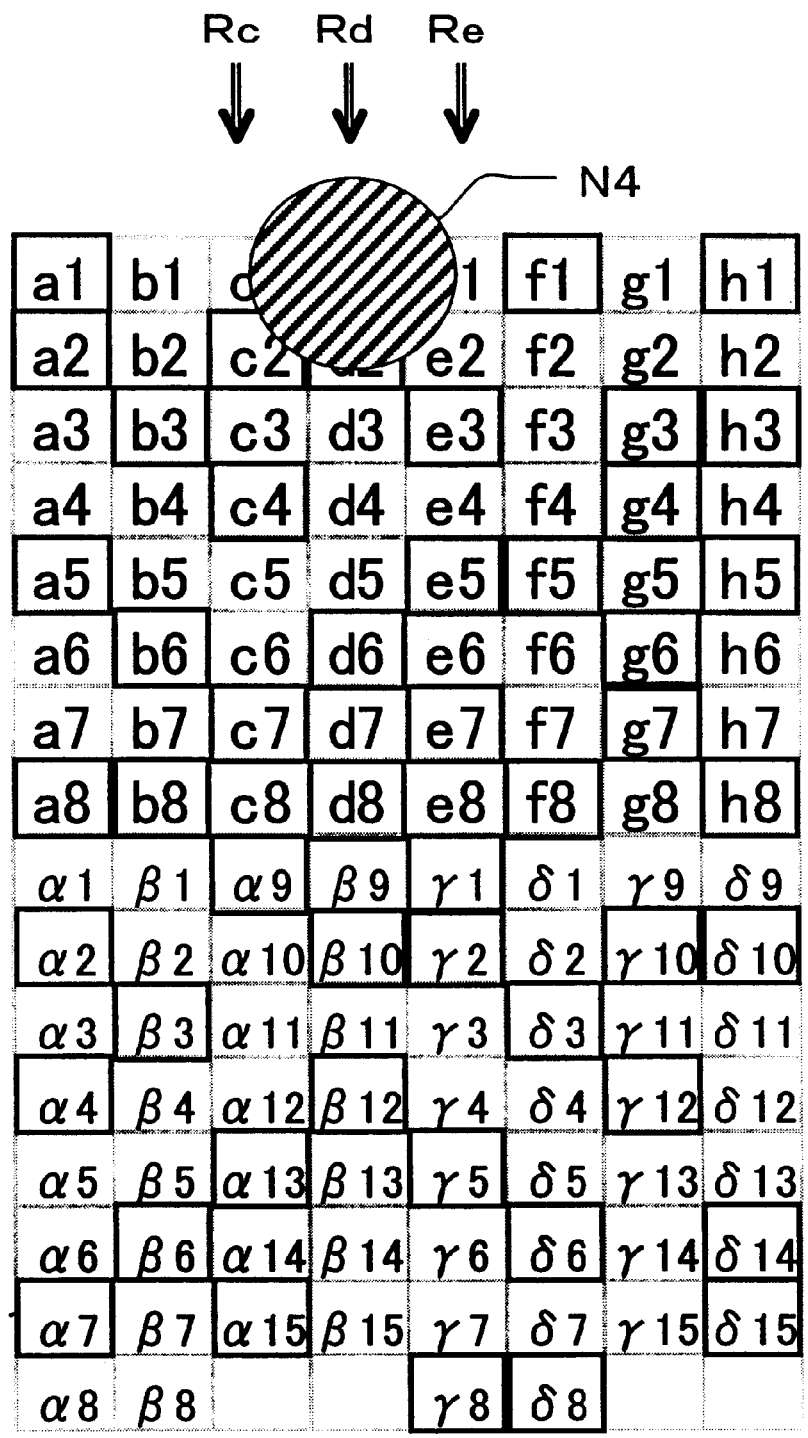
FIG. 18 is an example of a noise that covers some area.

If there is a noise N4 that covers some area on a two-dimensional image as shown in FIG. 18, three blocks R out of the 8-bit correction sets, (sets or blocks R containing error-correcting codes) have each two bits broken by the noise N4. The three blocks R are block Rc (bits c1–c8), block Rd (bits d1–d8) and block Re (bits e1–e8). Therefore, the Hamming decoder 7A can not correct the error bits by its random error-correcting function (Step 5e-2; see Step 5e-1).

Then, the bit data is handed over to the Reed-Solomon decoder 8A and subjected to burst error correcting treatment (Step 6e). In case a noise N4 covering some area remains on the two-dimensional image as shown in FIG. 18, however, three blocks Re, Rd and Re out of the blocks R, are broken, exceeding the error-correcting function capacity of up to two blocks of the Reed-Solomon encoding mode. Therefore, the error bits can not be corrected at this stage (Step 7e-2; see Step 7e-1). It is noted that the Reed-Solomon encoding mode corrects errors in blocks, that is, block by block.

Figure 19:
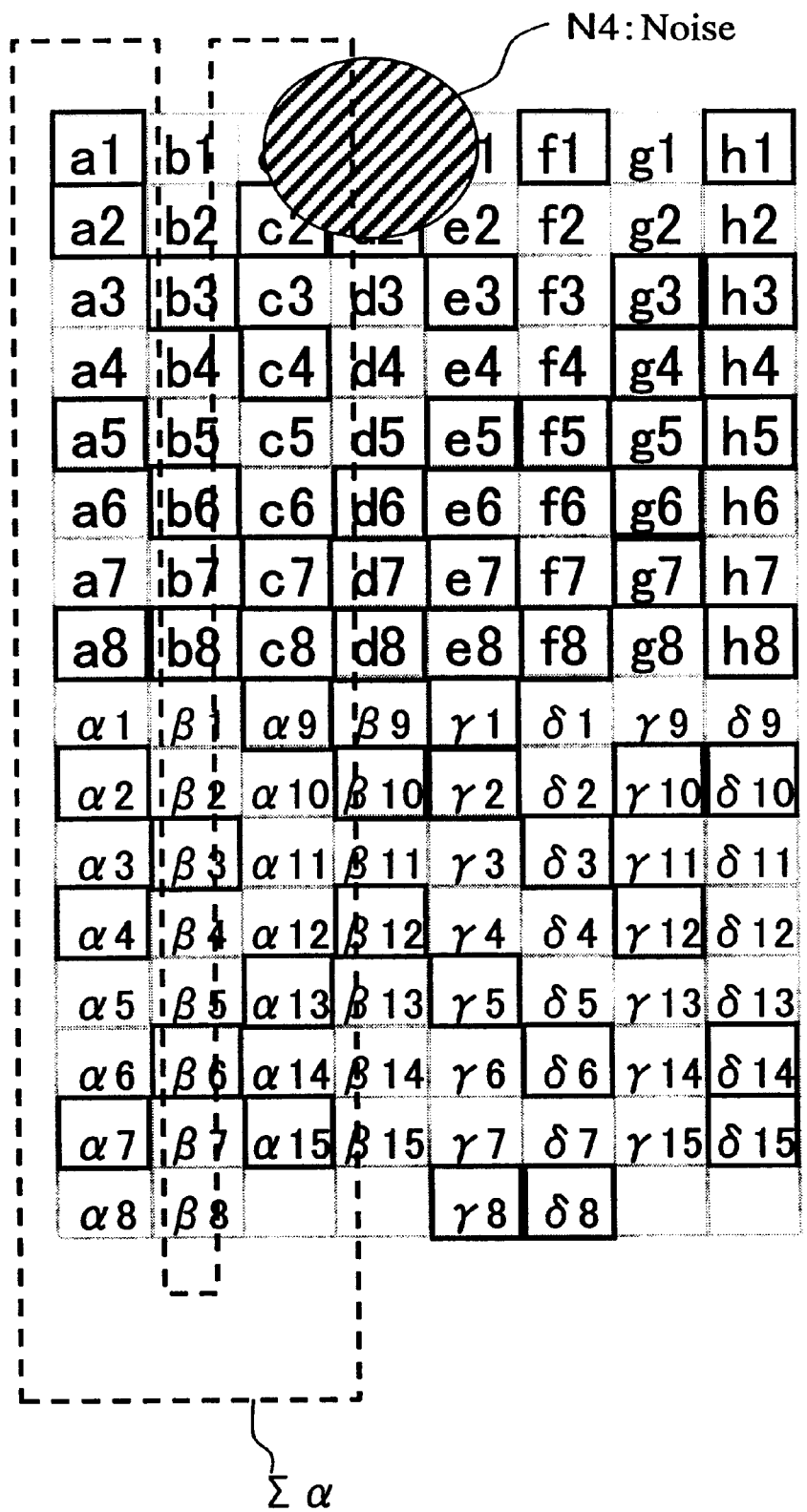
FIG. 19 is an explanatory illustration in which an error is corrected by the BCHG code.
Figure 20:
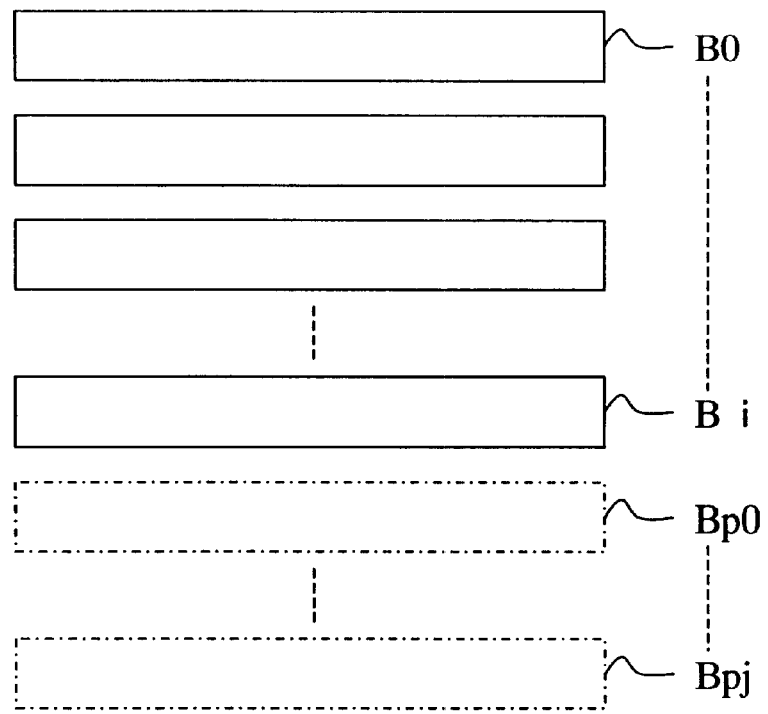
FIG. 20 is an explanatory illustration in which an error-correcting function is added by the Reed-Solomon code mode.
Figure 21:
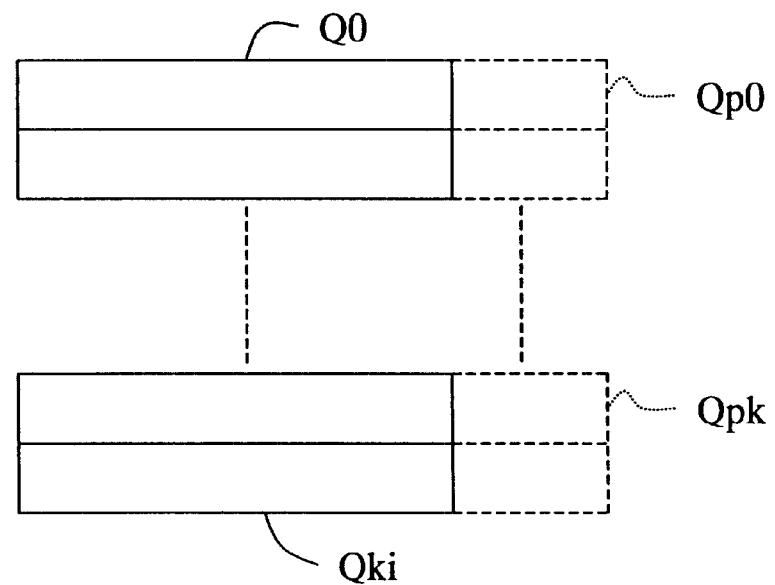
FIG. 21 is an explanatory illustration in which an error-correcting function is added by the Hamming code mode.

The bit data is then referred to the BCH decoder 17A for correction (Step 8e). In this correction, if the 31 bits, that is, a1–a8, α1–α8, c1–c8, α9–α15, as seen in the BCH encoding mode as shown in FIG. 19 is taken as one lump Σ (in this case, Σα), the number of error bits in this Σα is not larger than three. Therefore, the error bits can be corrected at this stage (Step 9e).

Thus, the bit data is restored to the original state through the Hamming decoder 7A, the Reed-Solomon decoder 8A and the BCH decoder 17A, and then forwarded to the data inputting and outputting means 3A to be outputted (Steps 10e–11e).

In the third embodiment as in the second embodiment, a plurality of relocation maps may be provided and, depending on the direction of probable linear noises and the like, the user may choose a suitable relocation map through a key board, or the like, from among the provided plurality of relocation maps. It is also noted that the relocation maps are not limited to the ones with the arrangement orders shown in this embodiment, but may comprise any arrangement order within a specific two-dimensional region.

In any of the embodiments of the present invention, it is also possible to drop the relocation maps and use bit data as two-dimensional image at two-dimensional image generating means 6A as they are sent in from the Hamming encoder 4A or the Reed-Solomon encoder 5A.

The present inventors have also disclosed an image information processing apparatus in which image data corresponding to document images inputted by image inputting means such as a scanner are stored on a built-in magnetic disk or the like as image file and in which the image file thus stored can be printed out again as by printer. According to that, it is possible to print the two-dimensional code onto a specific page of the above-mentioned document image and to specify the aforesaid stored document image on the basis of the two-dimensional code.

Two-dimensional codes have been take up in the description. The two-dimensional images applicable in the present invention are not limited to two-dimensional codes but include all the two-dimensional images that can be obtained by encoding a set of bit data.

As set forth above, the present invention encodes and decodes bit data using two error-correcting modes—the random error-correcting code mode and the burst error-correcting code mode. That is, the burst error-correcting code deals with noises in the longitudinal direction of a set of random-encoded bit data. And the random error-correcting code acts on noises covering a plurality of blocks of burst-encoded bit data. Therefore, it is possible to have the error-correcting function work on noises resting on the two-dimensional image in any direction without fail. It is also noted that the use of a plurality of the random error-correcting codes and the burst error-correcting codes makes it possible to correct errors caused by noises more complicated in shape.

It is also possible to work out a relocation map of bit data according to the direction of noise or modify the relocation map depending on which linear noise, in the longitudinal or latitudinal direction, is liable to rest on the two-dimensional image. By so arranging that the direction of the bit data block and the noise direction cross each, priority can be given to the speedier random error-correcting code mode. Thus, the decoding time including the error-correcting time can be reduced to a minimum.

What is claimed is:

1. A data encoding apparatus that is provided with:
   first encoding means for encoding a set of bit data by adding a first error-correcting code thereto,
   second encoding means for encoding the set of bit data encoded by said first encoding means by adding a second error-correcting code thereto, said set of bit data encoded by the first encoding means,
   two-dimensional image generating means for generating a two-dimensional image by arranging the bit data on a specific region in columns and rows, said bit data encoded by said first and second encoding means,
   a relocation map showing the order in which the bit data encoded by said first and second encoding means are rearranged, and
   relocation means for rearranging said encoded bit data on a two-dimensional region according to said relocation map and handing that over to said two-dimensional image generating means,
   a relocation map showing the order in which the bit data encoded by said first and second encoding means are rearranged, and
   relocation means for rearranging said encoded bit data on a two-dimensional region according to said relocation map and handing that over to said two-dimensional image generating means, relocation map holding means holding said plurality of relocation maps, and relocation map specifying means which selects a relocation map to be used by said relocation means, wherein said relocation map specifying means selects the relocation map in which the direction of the most frequent bit error and the longitudinal direction of the set of said bit data cross each other.

2. The data encoding apparatus according to claim 1 that is provided with two-dimensional image printing means for printing said two-dimensional image on media.

3. The data encoding apparatus according to claim 1 that is provided with said relocation map on which a set of bit data given an addition of said random error-correcting code are arranged in one direction, in columns or in rows, within said two-dimensional region.

4. The data encoding apparatus according to claim 1 that is provided with said relocation map on which a set of bit data given an addition of said burst error-correcting code are arranged in one direction, in columns or in rows, within said two-dimensional region.

* * * * *